US012187655B2

(12) United States Patent
Goujard et al.

(10) Patent No.: US 12,187,655 B2
(45) Date of Patent: Jan. 7, 2025

(54) CONSOLIDATION METHOD USING GAS PHASE INFILTRATION

(71) Applicant: SAFRAN CERAMICS, Le Haillan (FR)

(72) Inventors: Stéphane Roger André Goujard, Moissy-Cramayel (FR); Adrien Delcamp, Moissy-Cramayel (FR); Cédric Descamps, Moissy-Cramayel (FR); Thierry Guy Xavier Tesson, Moissy-Cramayel (FR); Charles Leleu, Moissy-Cramayel (FR)

(73) Assignee: SAFRAN CERAMICS, Le Haillan (FR)

( * ) Notice: Subject to any disclaimer, the term of this patent is extended or adjusted under 35 U.S.C. 154(b) by 25 days.

(21) Appl. No.: 17/799,739

(22) PCT Filed: Feb. 10, 2021

(86) PCT No.: PCT/FR2021/050243
§ 371 (c)(1),
(2) Date: Aug. 15, 2022

(87) PCT Pub. No.: WO2021/165599
PCT Pub. Date: Aug. 26, 2021

(65) Prior Publication Data
US 2023/0399268 A1 Dec. 14, 2023

(30) Foreign Application Priority Data
Feb. 19, 2020 (FR) ........................................ 2001672

(51) Int. Cl.
*C04B 41/45* (2006.01)
*B28B 11/08* (2006.01)

(52) U.S. Cl.
CPC ............ *C04B 41/457* (2013.01); *B28B 11/08* (2013.01); *C04B 41/4529* (2013.01); *C04B 2235/614* (2013.01)

(58) Field of Classification Search
CPC .............. C04B 41/457; C04B 41/4529; C04B 2235/614
See application file for complete search history.

(56) References Cited

U.S. PATENT DOCUMENTS

| 2015/0075428 A1 | 3/2015 | Bertrand et al. |
| 2020/0157679 A1* | 5/2020 | She ........................ C23C 16/045 |

FOREIGN PATENT DOCUMENTS

| CN | 103930594 A | 7/2014 |
| EP | 1 452 624 A2 | 9/2004 |

(Continued)

OTHER PUBLICATIONS

International Search Report as issued in International Patent Application No. PCT/FR2021/050243, dated Jun. 29, 2021.

*Primary Examiner* — Shamim Ahmed
*Assistant Examiner* — Bradford M Gates
(74) *Attorney, Agent, or Firm* — Pillsbury Winthrop Shaw Pittman LLP

(57) ABSTRACT

A method of consolidation includes placing a fibrous preform in the shaping recess of a shaping tool, and supplying the shaping tool with a gas phase to obtain a deposit in the fibrous preform, the shaping tool for the vapor phase chemical infiltration including first and second portions, having respectively first and second shaping zones surrounded by a first and second edge zones, the first and the second shaping zone defining a shaping recess to receive the fibrous preform. A gas injection port is present at least partially in the first or second edge zone and a gas outlet port is present at least partially in the first or second edge zone, the gas injection port and the gas outlet port placing the shaping (Continued)

recess in fluid communication with the outside of the shaping tool. Outer faces of the first and second portion are impermeable to gas.

9 Claims, 2 Drawing Sheets

(56) References Cited

FOREIGN PATENT DOCUMENTS

| | | |
|---|---|---|
| FR | 3 021 671 A1 | 12/2015 |
| JP | H05-161957 A | 6/1993 |
| KR | 10-1934374 B1 | 1/2019 |

* cited by examiner

[Fig. 1]
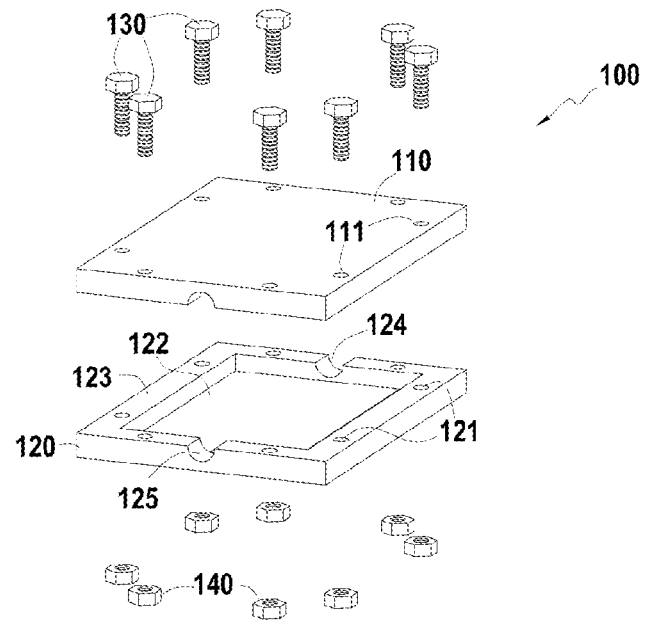
[Fig. 2]
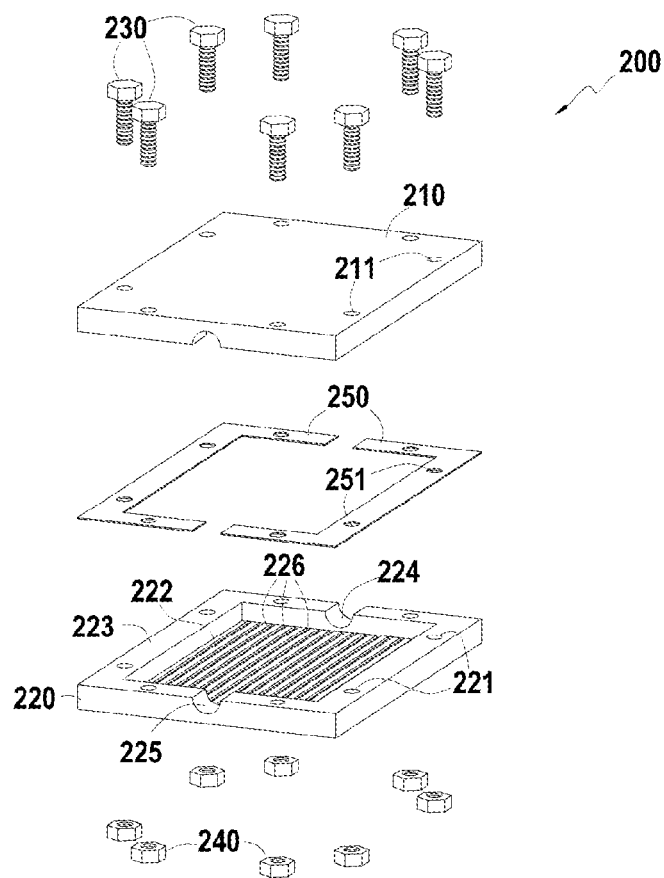

[Fig. 3]
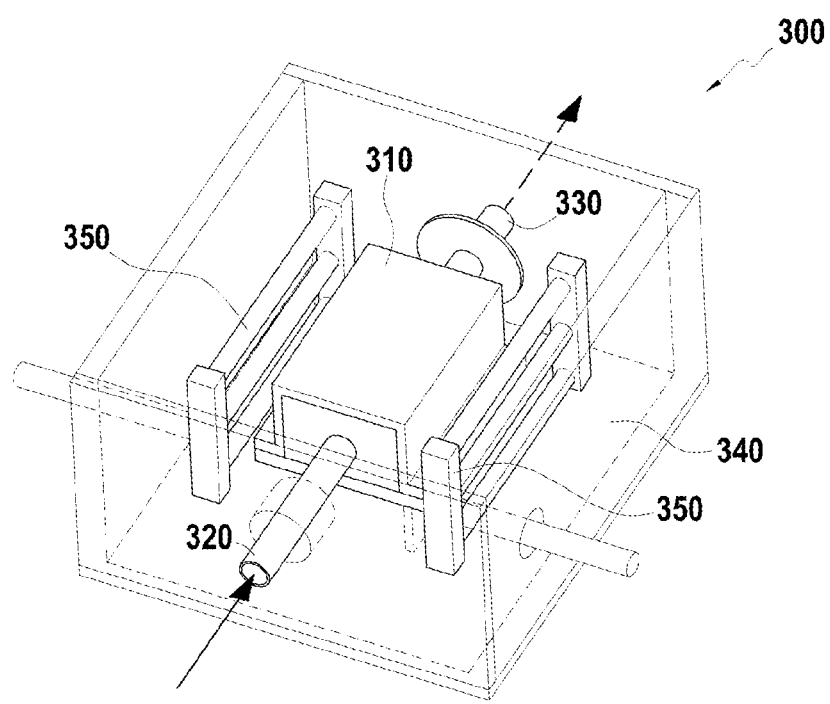

CONSOLIDATION METHOD USING GAS PHASE INFILTRATION

CROSS-REFERENCE TO RELATED APPLICATIONS

This application is the U.S. National Stage of PCT/FR2021/050243, filed Feb. 10, 2021, which in turn claims priority to French patent application number 2001672 filed Feb. 19, 2020. The content of these applications are incorporated herein by reference in their entireties.

TECHNICAL FIELD

The present invention relates to the production of parts of composite material, and more particularly a consolidation and/or densification method by gas phase chemical infiltration of a preform intended to form a reinforcement of a part of composite material.

PRIOR ART

One field of application of the invention is that of producing parts of composite material of a thermostructural composite material, i.e. a composite material having both mechanical properties that make it able to constitute structural parts and the capacity to retain these properties up to elevated temperatures. Typical examples of thermostructural composite materials are carbon/carbon (C/C) composites having a carbon fiber reinforcement texture densified by a pyrolytic carbon matrix and ceramic matrix composites (CMC) having a reinforcement texture of refractory fibers (carbon or ceramic) densified by a ceramic matrix.

A well-known process for consolidation or densification of fibrous preforms for producing parts of C/C or CMC composite is gas phase chemical infiltration (CVI). The fibrous preforms to be consolidated or densified are placed in a multiperforated shaping tool, itself placed in a reactor or oven where it is heated. A reactive gas containing one or more gas precursors of the material constituting the matrix is introduced into the reactor. The temperature and the pressure in the reactor are adjusted to allow the reactive gas to diffuse within the porosity of the preforms via the perforations of the shaper and to form there a deposit of material constituting the matrix by decomposition of one or more constituents of the reactive gas or by reaction between several constituents, these constituents forming the precursor of the matrix. An interphase material can further be deposited with the matrix by this method.

However, this consolidation or densification technique causes, in certain cases, the appearance of gradients of the matrix deposit in the thickness direction of the fibrous preform as well as local excess thicknesses or "pimples" on the surface of the preform. In fact, at the location of the perforations of a shaper according to the prior art, the texture is not maintained and has a tendency to extend into the free space. The surface condition of the part is unfavorable affected as a result.

Moreover, the shapers are generally introduced into a reaction chamber of a densification oven that is much larger than the shapers themselves, so that a portion of the introduced gas phase can pass through the chamber of the densification oven without passing through the shapers, and therefore does not contribute to the densification of the preforms. The result is an economic loss for the user, a method of this type requiring a greater injection of the reactive phase.

Moreover, the chambers of the densification ovens and the outer faces of the shapers also undergo undesired deposits when the reactive gas phase reacts before entering into contact with the preform present in the shapers. Over the long term, these deposits cause fouling and therefore undesired premature aging of the densification oven and of the shapers leading to the introduction of cleaning operations or reducing their possible duration of use.

There remains an industrial need for a vapor phase chemical infiltration shaping method which allows the shaping of a preform and which is not associated with the disadvantages described above.

DISCLOSURE OF THE INVENTION

The invention responds to this need by proposing a consolidation method comprising the steps consisting of:
  placing a fibrous preform in the shaping recess of a shaping tool;
  supplying the shaping tool with a gas phase to obtain a deposit in the fibrous preform,
the shaping tool for the vapor phase chemical infiltration of a fibrous preform comprising a first portion, one face of which has a first shaping zone surrounded by a first edge zone, and a second portion, one face of which has a second shaping zone surrounded by a second edge zone, the first and the second shaping zone defining, when the first edge zone is brought into contact with the second edge zone, a shaping recess with a given shape intended to receive the fibrous preform, characterized in that at least one gas injection port is present at least partially in the first or in the second edge zone and a gas outlet port is present at least partially in the first or in the second edge zone, the gas injection port and the gas outlet port placing the shaping recess in fluid communication with the outside of the shaping tool,
and in that the outer faces of the first and of the second portion are impermeable to gas.

A method of this type advantageously uses a tool allowing forcing the passage of the gas phase within the preform present in the shaping recess. In a shaping tool of this type, the gas phase can be introduced directly into the shaping recess via the gas injection port, and the reactive species of the gas phase more easily generate a deposit in the preform as desired. The depositing efficiency is thereby increased in comparison with the shapers of the prior art. Moreover, the aging of the shaper due to the undesired deposition of undesired species originating in the reactive gas phase, such as SiC or BN for example, is thereby reduced because only the faces of the shaping zones of the shapers of a method according to the invention are in contact with the gas phase and can thus be subject to an undesired solid deposit. Moreover, it is easier to renovate a shaper of a method according to the invention because it requires only re-machining the shaping zones and not the entire shaper as with the shapers of the prior art. Finally, the supply of the reactive gas phase is directly accomplished in the shaping recess and therefore closest to the preform. The kinetics of deposition are thereby increased in comparison to shapers of the prior art with multi-perforated walls placed in a densification oven.

In the tooling for a method according to the invention, the shaping zones of the first portion and of the second portion can be shaped such that the shaping recess has the shape of the desired part after shaping.

The edge zones can extend like the zone of the first or of the second portion of the shaper which surrounds the shaping zone.

In the tool for a method according to the invention, the shaping recess is obtained by the reunion of the first and of the second portion by bringing into contact at least one portion of the first edge zone with the second edge zone.

In one embodiment of the invention, the shaping tool comprises at least one first portion of a gas injection port provided in the first edge zone, and a second portion of a gas injection port in the second edge zone. Thus, when bringing into contact the edge zones of the first and of the second portion of a tool for a method according to the invention, the first and second portions of an injection port form together a gas injection port allowing placing the shaping recess in fluid communication with the outside of the tool.

In one embodiment of the invention, the shaping tool comprises at least a first portion of a gas outlet port provided in the first edge zone, and a second portion of a gas outlet port in the second edge zone. Thus, during the contacting of the edge zones of the first and of the second portion of a tool for the method according to the invention, the first and second portions of a gas outlet port form together a gas outlet port allowing placing the shaping recess into fluid communication with the outside of the tooling.

A tool for a method according to the invention can have more than one gas injection port.

A tool for a method according to the invention can have more than one gas outlet port.

What is meant by "place into fluid communication" in the sense of the invention is that a gas phase, possibly under pressure, can reach from the outside of the tool to the shaping recess defined by the shaping zones of the tool.

The scope of the invention is still not departed from when the first and second edge zones are not in direct contact to form the shaping recess.

In one embodiment, a shaping tool can comprise a gasket between the first and the second edge zones.

Such a gasket can advantageously ensure that the shaping recess is in fluid communication with the outside of the tool only through gas injection and outlet ports. For example, a gasket of this type can be composed of a compressible refractory material such as expanded graphite, for example sold under the commercial designations Payex® or Sigraflex®.

A gasket of this type allows ensuring that the gas phase passes through the entire preform contained in the shaping recess. In this embodiment, the efficiency of the depositing of the gas phase in the fibrous preform is increased in comparison with a shaper of the prior art.

In one embodiment, the first and second portions of the tool also have attachment means able to hold them together.

For example, such attachment means can be clamping members of the screw and nut type located in recesses provided for this purpose in the first and second edge zones.

In one embodiment, at least one of the shaping zones comprises one or more gas phase flow relief(s). Such flow reliefs can, for example, be grooves etched in the shaping zones.

The gas phase flow reliefs advantageously allow the gas to penetrate into the fibrous preform present in the shaping recess over the entire surface of the preform facing the flow reliefs. Such flow reliefs are particularly preferred in the case where the gas phase comprises a precursor that is sensitive to depletion and/or inhibition phenomena of deposition reactions by the reaction products. The flow reliefs thus allow adjusting the pressure difference between the gas entering the tool and the gas leaving the shaping tool. The flow reliefs then allow obtaining a more homogeneous deposit.

Such gas phases that are sensitive to depletion and/or inhibition phenomena can for example be composed of methyltrichlorosilane (MTS) and of hydrogen to give a deposit of silicon carbide. It is known to a person skilled in the art that SiC deposition produces hydrogen chloride HCl. But an increase in the concentration of HCl in the gas phase induces a decrease in the kinetics of deposition. In fact, HCl occupies sites on the surface of the substrate which oppose the adsorption of the molecules responsible for the deposition of SiC.

In an alternative embodiment, the shaping zones of the first and of the second portion form a shaping recess with dimensions conforming to those of the part that it is desired to obtain. In other words, the shaping zones are free of flow reliefs for the gas phase such as those described above. An embodiment of this type is preferred when the gas phase is less sensitive to phenomena of depletion and/or inhibition. It is then in fact preferred that the gas phase pass through the entirety of the fibrous preform.

In one embodiment, the fibrous preform is a preform of silicon carbide fibers. In another embodiment, the preform is of carbon fibers or of boron fibers. Oxide fibers can also be used.

In one embodiment, the reactive gas phase can be selected to carry out a deposit of pyrolytic carbon from a mixture of methane and propane, of boron nitride, from a mixture of boron trichloride, ammonia and hydrogen, of silicon carbide from MTS and hydrogen.

According to the invention, the outer faces of the first and of the second portion are impermeable to gas.

What is meant by "outer face" of the first or of the second portion is the face of the first or of the second portion opposite to the face bearing the shaping zone.

What is meant by "impermeable to gas" is that a gas phase, even under pressure, cannot pass through the outer face to reach the shaping recess.

For example, the outer faces of the first and of the second portion are bereft of any interstice which would allow the passage of a gas from the outside of the tool to the shaping recess other than via the gas injection port or the gas outlet port.

Such an embodiment allows avoiding the formation of pimples observed in shapers with multi-perforated walls of the prior art.

According to another of its aspects, the invention also relates to an installation for densifying fibrous preforms for implementing the method described above, comprising a shaping tool like that described above, a means for heating the shaping tool and a gas phase source connected to the gas injection port of the shaping tool.

An installation of this type allows injecting the gas phase directly into the shaping recess of the tool and thus obtaining a deposit with better efficiency than with the installations of the prior art.

In one embodiment, the densification installation further comprises an effluent reaction zone connected to the gas outlet port of the shaping tool. Generally, this zone is placed at a temperature at least equal to the temperature of the zone comprising the shaper to continue the deposition reaction beyond the part to be consolidated.

A zone of this type allows making the gases of the gas phase not having reacted in the shaping tool react so as to facilitate the treatment of the effluents at the outlet of the installation. For example, a zone of this type can contribute to limit the formation of undesirable species in other locations of the installation, and particularly deposits that foul the gas discharge pipes of the installation. This allows reducing the cleaning phases of the pipes, obtaining a better control of the pressure in the entire densification installation by eliminating the risk of plugs forming.

In one embodiment, the installation further comprises an intermediate zone between the gas phase source and the shaping tool. An intermediate zone of this type allows pre-heating the gas phase and/or the maturation of the gas phase, i.e. allows the activation of the reagents contained in the gas phase and thus a better depositing efficiency or obtaining a suitable deposit composition or a particular microstructure when the gas phase is introduced into the shaper.

In another embodiment, the installation further comprises, between the gas phase source and before the shaping tool, a flow rate distribution zone. This distribution function can advantageously be included in the intermediate zone. This function is only useful in the case where a plurality of ports is provided to allow the reactive gas phase to enter the shaper. The object of this zone is to obtain a homogenous gas supply of the preform in which the deposit is formed, ideally by dividing the total flow rate into as many equal flow rate fractions as there are ports present.

In a consolidation method of the invention, the gas phase can be selected among methane, propane, methyltrichlorosilane, silane, ethylene, boron trichloride, ammonia, it being understood that these species can be taken alone, as a mixture with other gases such as hydrogen, nitrogen or argon.

In one embodiment, a method of the invention comprises the introduction of a first gas phase allowing the deposition of an interphase of pyrolytic carbon or of boron nitride on the fibers constituting the preform, then of a second gas phase allowing the deposition of a carbide such as silicon carbide to cover the interphase deposit.

In an embodiment of this type, the first gas phase can comprise boron trichloride, ammonia and hydrogen, or be constituted of boron trichloride, ammonia and hydrogen. The second gas phase can comprise MTS and hydrogen, or be constituted of MTS and hydrogen.

According to another of its aspects, the invention relates to a densification method comprising a first step in which a fibrous preform is consolidated by the consolidation which was just described and by means of a shaping tool as described above, then at least one second step in which the preform thus consolidated is placed in a densification oven of the prior art to continue its densification.

On the one hand, a method of this type allows obtaining more rapid densification of a fibrous preform, because the consolidation is initiated by means of a shaping tool as described above allowing depositing with better efficiency than conventional densification methods. On the other hand, in this method the densification of the fibrous preform is completed in a conventional densification oven, allowing ensuring that the levels of densification attained for the fibrous preform are at least as great as those of the preforms densified completely by the methods of the prior art. Finally, defects of the "pimple" type possibly observed on parts obtained by the methods of the prior art are avoided.

BRIEF DESCRIPTION OF THE DRAWINGS

FIG. 1 shows a shaping tool in an embodiment of a method according to the invention.

FIG. 2 shows a shaping tool in another embodiment of a method according to the invention.

FIG. 3 shows a shaping tool in an embodiment of the invention.

DESCRIPTION OF THE EMBODIMENTS

Shaping tools according to embodiments of methods of the invention will now be described in connection with the figures, which must not be interpreted as limiting the invention.

FIG. 1 shows a shaping tool 100 according to a first embodiment.

A tool 100 of this type is formed of a first portion 110 and a second portion 120. These two portions 110, 120 can be held together by means of screws 130 and nuts 140 passing through the first portion 110 through ports 111 and the second portion through ports 121 provided for this purpose in the edge zones of the first and second portions.

The second portion comprises a shaping zone 122 and an edge zone 123. The shaping zone 122 has, in this embodiment, an indentation with respect to the edge zone 123. The shape of the indentation in the shaping zone 122 can be selected to conform to the shape desired for the part that it is desired to obtain after consolidation.

What is meant here by "consolidation" is a partial densification of a fibrous preform to a level sufficient for obtaining a self-supporting preform which can subsequently be placed in a densification oven, without a shaping tool, to finalize its densification.

In the embodiment shown in FIG. 1, the first portion 110 can be identical to the second portion 120.

In this embodiment, the contacting of the edge zone 123 of the second portion with the edge zone of the first portion defines a shaping recess by the association of the indentation provided between the shaping zone 122 and the edge zone 123 of the second portion, and that of the shaping zone of the first portion not visible in the drawing. In the embodiment shown, the contacting of the two edge zones also allows forming, in the edge zones, a gas injection port 125 and a gas outlet port 124.

In an embodiment not shown in the figures, the gas injection port 125 can be entirely provided in the edge zone of the first portion or in that of the second portion.

In the shaping tool 100 shown, the gas injection port 125 and the gas outlet port 124 are formed by the reunion of two complementary openings provided in the edge zones of the first and second portions.

In an embodiment not shown in the figures, the gas outlet port can be entirely provided in the edge zone of the first portion or in that of the second portion.

In a shaping tool for a method of the invention, the passage of the reactive gas phase through the fibrous preform is forced by the geometry of the shaper. In fact, due to the sealing of the shaping recess between the gas injection port and the gas outlet port, the entirety of the gas phase passes into the fibrous preform.

In the embodiment presented, the outer face of the first portion 110 is impermeable to gas, and the same is true for the outer face of the second portion.

Thus, the gas phase can only enter into the shaping recess or leave it via the gas injection port 125 and the gas outlet port 124.

The impermeability to gas of the outer face of the first and of the second portion can be ensured by the material selected for the first and second portion.

In one embodiment, the first and the second portion can be produced in graphite. In another embodiment, the first and the second portion can be made of C/C composite material, sealed if necessary by a surface deposit or seal coat. In another embodiment, the first portion 110 and the second portion 120 can be made of sintered SiC material.

FIG. 2 shows a shaping tool according to another embodiment of a method of the invention.

As with the tool shown in FIG. 1, the tool has a first portion 210 and a second portion 220. The second portion has a shaping zone 222, and an edge zone 223. The first portion 210 is symmetrical with the second 220.

Ports 211 and 221 allowing the passage of screws 230 through the first and the second portion are present. They allow closing the shaping tool by means of screws 230 and nuts 240.

The tool shown further comprises gaskets 250 placed between the edge zones of the first and second portions 210, 220. These gaskets also have ports 251 allowing ensuring the passage of the screws 230.

In this embodiment, the gaskets insure improved sealing for the shaping recess. As described above, the sealing of the shaping zone allows ensuring a deposit from the gas phase solely in the fibrous preform housed in the shaping recess.

The gaskets 250 can have a width that is less than or equal to the width of the edge zone.

In the embodiment shown in FIG. 2, gas phase flow reliefs 226 are present in the second shaping zone 222. Gas phase flow reliefs can also be present in the first shaping zone not visible in the drawing.

These flow reliefs allow the gas phase to circulate in the shaping recess when the fibrous preform is present in it. Thus, the gas phase can penetrate into the fibrous preform all along the fibrous preform, and thus all plugging of the pores of the fibrous preform facing the gas injection port 225 is avoided.

Such flow reliefs 226 can for example be etched into the shaping zone 222. Of course, the dimension of the gas phase flow reliefs 226 is selected to not substantially modify the shape of the shaping recess.

In one embodiment, the grooves can have a width not exceeding 3.0 mm, comprised for example between 0.1 mm and 3.0 mm.

In one possibly complementary embodiment, the grooves form an angle comprised between 1° and 45°, preferably comprised between 1° and 20°, or between 2° and 10° with respect to the direction of the fibers in the texture introduced into the shaping zone.

An angle of this type between the grooves and the fibers of the preform allows ensuring that the yarns of the texture cannot expand in the groove, which further reduces the risk of the formation of pimples.

In one embodiment, the preform is introduced into the shaping zone 222 so that the fibers of the preform are substantially parallel to the direction between the gas injection port 225 and the gas outlet port 224. In this embodiment, the angle formed by the grooves is measured with respect to the direction between the gas injection port 225 and the gas outlet port 224.

For example, the gas phase flow reliefs 226 can be grooves etched in the shaping zone 222, parallel to the direction between the gas injection port 225 and the gas outlet port 224 or forming an angle with this direction as specified above. Such flow reliefs can for example have a depth comprised between 0.1 mm and 3.0 mm, a spacing between two grooves comprised between 2.0 mm and 5.0 mm, and a width comprised between 0.1 mm and 3.0 mm.

For example, the grooves can have a length comprised between 10% and 100% of the length of the shaping zone.

As specified above, such gas phase flow reliefs 226 are particularly advantageous in the case where the gas phase depletes rapidly when it passes through the fibrous preform, or there exists a deposit inhibition phenomenon. In fact, such flow reliefs allow the penetration of the gas phase into the preform all along the routing direction of the gas phase, from the gas injection port 225 to the gas outlet port 224, and thus the homogeneity and the densification of the part obtained after densification is better than in the absence of gas phase flow reliefs 226.

FIG. 3 shows an installation according to the invention allowing the consolidation of fibrous preforms by vapor phase chemical deposition.

And installation 300 of this type comprises a shaping tool 310, or shaper, according to an embodiment described above.

The installation 300 further comprises a means of heating the shaping tool 350. Any heating mode can be used provided that it allows attaining the desired deposition temperatures. For example, in the embodiment presented, heating is provided by radiation and convection via graphite bars 350 located in proximity to the shaping tool 310.

The densification installation 300 further comprises a gas phase source, not shown, and a pipe for routing the gas phase 320 receiving the gas from the gas phase source, the routing pipe 320 being in communication with the gas injection port of the shaper.

A densification installation according to the invention can comprise several gas phase sources. For example it is possible to have two distinct gas phase sources, and the user can select which of the two sources he wishes to connect to the routing pipe 320.

An embodiment of this type allows accomplishing two successive treatments of the same fibrous preform, without replacing the source, but simply by connecting the routing pipe 320 to one or to the other of the sources. This embodiment is particularly preferred with an interphase is deposited on the fibrous preform, before its densification.

In one embodiment of the invention, the same gas phase source allows supplying several consolidation installations 300.

In the embodiment shown, the densification installation 300 also comprises a gas outlet pipe 330 in communication with the gas outlet port of the shaper.

The installation 300 shown also has an insulating enclosure 340. An enclosure of this type allows optimizing the heating capacity of the heating system 350 by reducing the heat which is not transmitted to the shaping tool.

EXAMPLES

Example 1: Consolidation of a Preform with an Interphase

A 3D texture based on HiNiC type S silicon carbide fibers is introduced into a shaping tool made of graphite as described above.

The deposition of a BN interphase is accomplished by connecting a gas phase source to the gas injection port of the shaping tool. The gas phase source provides a supply of $NH_3$ and $BCl_3$, the flow rate ration between $NH_3$ and $BCl_3$ being comprised between 1 and 3 and $NH_3$ and $BCl_3$ being diluted in a gas selected among dihydrogen, dinitrogen or argon, advantageously dinitrogen. The BN deposit is accomplished at a temperature comprised between 700° C. and 900° C.

The gas phase source provides an $NH_3$ flow rate comprised between 100 and 1000 standard $cm^3$ per minute, a BCl$_3$ flow rate comprised between 100 and 500 standard cm$^3$ per minute and a diluting gas flow rate comprised between 100 and 5000 standard cm$^3$ per minute. A BN deposit of approximately 0.3 to 1 μm in thickness is thus obtained.

The fibrous preform on which the BN has been deposited is then densified by SiC by connecting the gas injection port of the shaping tool to a supply source of methyltrichlorosilane and hydrogen.

The depositing temperature is comprised between 900° C. and 1050° C. and the pressure comprised between 0.5 and 100 mbar.

The flow rate ratio between hydrogen and methyltrichlorosilane is comprised between 3 and 15. The flow rate of methyltrichlorosilane is comprised between 20 and 200 standard cm$^3$ per and the flow rate of hydrogen between 60 and 2000 standard cm$^3$ per minute, and allows obtaining a deposit of SiC on the BN previously deposited of approximately 0.3 to 2 μm in thickness.

In this example, the duration of the rise in temperature is on the order of 1 to 2 hours. The duration necessary for the production of the BN interphase is on the order of one hour and the duration of the production of the silicon carbide deposit is on the order of 2 to 3 hours.

The consolidation of the fibrous preform is therefore obtained in a time approximately ten times less than the time necessary for a shaping method of the prior art.

Example 2: Consolidation of a Preform with an Interphase

A 3D texture based on HiNiC type S silicon carbide is introduced into a shaping tool made of graphite as described above.

The deposit of a BN interphase is accomplished by connecting a gas phase source to the gas injection port of the shaping tool. The gas phase source ensures a supply of borazine B$_3$N$_3$H$_6$, diluted in a gas selected among dihydrogen, dinitrogen or argon, advantageously dinitrogen. The BN deposit is accomplished at a temperature comprised between 600° C. and 900° C.

To produce a BN deposit of approximately 0.3 to 1 μm in thickness, the gas phase source provides a flow rate of borazine comprised between 50 and 500 standard cm$^3$ per minute and a diluting gas flow rate comprised between 200 and 2000 standard cm$^3$ per minute.

The fibrous preform on which the BN has been deposited is then consolidated by SiC by connecting a supply source of silane SiH$_4$, of ethylene (C$_2$H$_4$) and of hydrogen to the gas injection port of the shaping tool.

The deposition temperature is comprised between 700° C. and 900° C. and the pressure comprised between 0.5 and 10 mbar. The flow rate ratio between silane and ethylene is comprised between 0.5 and 3, advantageously 2.

The flow rate of silane is comprised between 20 and 200 standard cm$^3$ per minute, the flow rate of ethylene is comprised between 20 and 150 standard cm$^3$ per minute and the flow rate of hydrogen is comprised between 20 and 500 standard cm$^3$ per minute.

A SiC deposit of approximately 0.3 to 2 μm thickness is thus obtained on the BN previously deposited.

In this example, the duration of the rise in temperature is on the order of 1 to 2 hours. The duration necessary for the production of the BN interphase is on the order of one hour and the duration of producing the silicon carbide deposit is on the order of 2 to 3 hours.

The consolidation of the fibrous preform is therefore obtained in a time approximately ten times less than the time necessary for a shaping method of the prior art.

Example 3: Pyrolytic Carbon Deposit

A 3D texture based on HiNiC type S silicon carbide fibers is introduced into a shaping tool made of graphite, as described above.

The gas injection port of the shaping tool is connected to a source of gaseous propane. The deposition temperature is comprised between 850° C. and 950° C., the pressure is comprised between 1 and 20 mbar.

The flow rate of propane from the source is comprised between 50 and 500 standard cm$^3$ per minute.

A pyrolytic carbon deposit of approximately 0.3 to 1 μm thickness is obtained.

In this example, the duration of the temperature rise is on the order of 1 to 2 hours. The duration necessary for the production of the silicon carbide deposit is on the order of 2 to 3 hours.

The consolidation of the fibrous preform is therefore obtained in a time approximately ten times less than the time necessary for a shaping method of the prior art.

The examples above have shown that the shaping tool allows a much more rapid consolidation of the fibrous preforms than with the shaping methods of the prior art.

The invention claimed is:

1. A consolidation method comprising:
   placing a fibrous preform in a shaping recess of a shaping tool,
   supplying the shaping tool with a gas phase to obtain a deposit in the fibrous preform, the shaping tool for vapor phase chemical infiltration of a fibrous preform comprising a first portion, one face of which has a first shaping zone surrounded by a first edge zone of the first portion, and a second portion, one face of which has a second shaping zone surrounded by a second edge zone of the second portion, the first and the second shaping zone defining, when the first edge zone is brought into contact with the second edge zone, a shaping recess with a given shape intended to receive the fibrous preform, wherein at least one gas injection port is present at least partially in the first or in the second edge zone and a gas outlet port is present at least partially in the first or in the second edge zone, the gas injection port and the gas outlet port placing the shaping recess in fluid communication with the outside of the shaping tool,
   and wherein outer faces of the first and of the second portion are impermeable to gas.

2. The consolidation method according to claim 1, wherein the shaping tool comprises a first portion of the gas injection port provided in the first edge zone, and a second portion of the gas injection port in the second edge zone.

3. The consolidation method according to claim 1, wherein the shaping tool comprises a first portion of the gas outlet port provided in the first edge zone, and a second portion of the gas outlet port in the second edge zone.

4. The consolidation method according to claim 1, wherein the shaping tool further comprises a gasket between the first and the second edge zones.

5. The consolidation method according to claim 1, wherein at least one of the first and second shaping zones of the shaping tool comprises one or more gas phase flow reliefs.

6. The consolidation method according to claim 1, wherein the gas phase is introduced directly into the shaping recess via the gas injection port.

7. An installation for the densification of fibrous preforms for the implementation of a method according to claim 1, comprising the shaping tool, a heater for heating the shaping tool and a gas phase source connected to the gas injection port of the shaping tool.

8. The installation for the densification of fibrous preforms according to claim 7, further comprising an effluent reaction zone connected to the gas outlet port of the shaping tool.

9. The installation for the densification of fibrous preforms according to claim 7, further comprising an intermediate zone between the gas phase source and the shaping tool.

\* \* \* \* \*